(12) United States Patent
Schmidt

(10) Patent No.: US 8,917,093 B2
(45) Date of Patent: Dec. 23, 2014

(54) LOCAL COIL FOR MAGNETIC RESONANCE APPLICATIONS AND A MAGNETIC RESONANCE SYSTEM

(75) Inventor: Sebastian Schmidt, Weisendorf (DE)

(73) Assignee: Siemens Aktiengesellschaft, München (DE)

( * ) Notice: Subject to any disclaimer, the term of this patent is extended or adjusted under 35 U.S.C. 154(b) by 473 days.

(21) Appl. No.: 13/408,845

(22) Filed: Feb. 29, 2012

(65) Prior Publication Data

US 2013/0057284 A1 Mar. 7, 2013

(30) Foreign Application Priority Data

Mar. 1, 2011 (DE) .......................... 10 2011 004 913

(51) Int. Cl.
*G01V 3/00* (2006.01)
*G01R 33/36* (2006.01)
*G01R 33/341* (2006.01)

(52) U.S. Cl.
CPC .......... *G01R 33/341* (2013.01); *G01R 33/3692* (2013.01); *G01R 33/3621* (2013.01)
USPC ....................................................... 324/322

(58) Field of Classification Search
USPC ................................................. 324/300–322
See application file for complete search history.

(56) References Cited

U.S. PATENT DOCUMENTS

| | | | |
|---|---|---|---|
| 4,885,538 A * | 12/1989 | Hoenniger et al. | 324/312 |
| 5,532,593 A * | 7/1996 | Maneval et al. | 324/306 |
| 7,592,813 B2 | 9/2009 | Boskamp et al. | |
| 2003/0058502 A1 | 3/2003 | Griffiths et al. | |
| 2008/0259897 A1 | 10/2008 | Van Helvoort et al. | |
| 2012/0139538 A1 * | 6/2012 | Schmidt et al. | 324/309 |
| 2013/0057278 A1 * | 3/2013 | Schmidt | 324/309 |
| 2014/0121496 A1 * | 5/2014 | Bi et al. | 600/413 |

FOREIGN PATENT DOCUMENTS

| | | |
|---|---|---|
| DE | 10 2007 026 915 A1 | 1/2009 |
| DE | 10 2008 048 476 A1 | 4/2010 |

OTHER PUBLICATIONS

German Office Action dated Aug. 23, 2011 for corresponding German Patent Application No. DE 10 2011 004 913.4 with English translation.

* cited by examiner

*Primary Examiner* — Dixomara Vargas
(74) *Attorney, Agent, or Firm* — Lempia Summerfield Katz LLC

(57) ABSTRACT

A local coil for magnetic resonance applications includes a receiving antenna operable to receive an analog magnetic resonance signal excited in an examination subject by an excitation signal. The local coil includes an analog-to-digital converter that is supplied with the received analog magnetic resonance signal from the receiving antenna. The analog-to-digital converter converts the analog magnetic resonance signal into a digital magnetic resonance signal. The local coil includes a first transmission system that is supplied with the digital magnetic resonance signal by the analog-to-digital converter and emits the digital magnetic resonance signal via a transmitting antenna at a first data rate into the environment of the local coil. The local coil includes a second transmission system that is different from the first transmission system. The second transmission system emits data into the environment of the local coil at a second data rate that is lower than the first data rate.

20 Claims, 1 Drawing Sheet

LOCAL COIL FOR MAGNETIC RESONANCE APPLICATIONS AND A MAGNETIC RESONANCE SYSTEM

This application claims the benefit of DE 10 2011 004 913.4, filed on Mar. 1, 2011.

BACKGROUND

The present embodiments relate to a local coil for magnetic resonance applications.

In the case of magnetic resonance systems (e.g., imaging magnetic resonance systems), the excitation of an examination subject may be effected with a whole body coil (body coil). The acquisition of excited magnetic resonance signals is achieved by local coils. Local coils enable the magnetic resonance signal to be received with a significantly better signal-to-noise (SNR) ratio than with whole body coils.

The received magnetic resonance signal is to be transmitted to a control and evaluation device of the magnetic resonance system. This transmission may initially be effected by suitable cables (e.g., coaxial cables). However, different approaches for transmitting the magnetic resonance signal such as, for example, via a radio link (e.g., wirelessly) to the control and evaluation device are also known. By way of example, reference is made to U.S. Pat. No. 7,592,813 B2.

One approach for the wireless transmission of the magnetic resonance signal includes digitizing the acquired analog magnetic resonance signal inside the local coil and sending the digital magnetic resonance signal via a radio link with a high data rate to the control and evaluation device. Very high carrier frequencies may be used for the digital data communication to achieve the required data rates. Radio links of this kind have very low ranges. For the actual measurement, this does not represent a problem, since, during the examination, the examination subject (e.g., a person) is located in an examination volume (e.g., a patient tunnel) of the magnetic resonance installation. A receiver arranged in the examination volume and connected to the control and evaluation device may, for example, communicate with the local coil without problems.

This procedure is disadvantageous when it is necessary to transmit data from the local coil to the control and evaluation device, or vice versa, prior to or after the actual examination. This is, for example, important for planning the examination. It is, for example, advantageous for the control and evaluation device to know the nature, position, status, etc. of the local coil used before the actual examination. However, this may not be possible with the systems of the prior art. The control and evaluation device may only be able to acquire details of the corresponding local coils when the local coil is introduced into the examination volume. This is, for example, unfavorable in the case of whole body examinations, with which local coils are attached to large areas of the people to be examined and introduced gradually into the examination volume of the magnetic resonance installation.

The situation is similar when the patient couch may be undocked from the magnetic resonance installation, and the patient is prepared for the examination in the undocked state of the patient couch (e.g., in a side room), and the corresponding information is to be made known to the system as early as this stage via the local coils.

SUMMARY AND DESCRIPTION

The present embodiments may obviate one or more of the drawbacks or limitations in the related art. For example, an advantageous local coil is provided.

In one embodiment, a local coil for magnetic resonance applications is provided. The local coil includes a receiving antenna for receiving an analog magnetic resonance signal excited in an examination subject by an excitation signal. The local coil also includes an analog-to-digital converter, to which the received analog magnetic resonance signal is supplied by the receiving antenna and which converts the analog magnetic resonance signal into a digital magnetic resonance signal. The local coil includes a first transmission system, to which the digital magnetic resonance signal is supplied by the analog-to-digital converter and which emits the digital magnetic resonance signal via a transmitting antenna at a first data rate into the environment of the local coil. The local coil includes a second transmission system that is different from the first transmission system and emits data into the environment of the local coil at a second data rate. The second data rate is lower than the first data rate.

The first transmission system sends the digital magnetic resonance signal at a high data rate. The data rate may, for example, be higher than 50 Mbit/s (e.g., higher than 100 Mbit/s). In order to be able to transmit high data rates of this kind, the first transmission system may, for example, have a carrier frequency within the one or two-digit GHz range. Carrier frequencies of 20 GHz, 60 GHz to 70 GHz and sometimes even up to 100 GHz are typical. The second transmission system works at a significantly lower second data rate. The second data rate is, for example, lower than 10 Mbit/s (e.g., lower than 1 Mbit/s). The carrier frequency of the second transmission system may also be significantly lower than the carrier frequency of the first transmission system. For example, the carrier frequency of the second transmission system may be within the MHz or the one-digit GHz range. For example, the second transmission system may be embodied as a Bluetooth or as a WLAN system according to the industry standards IEEE 802.15.1 and IEEE 802.11.

The first transmission system and the second transmission system may be operated simultaneously. The first transmission system and the second transmission system may, however, be interlocked against each other.

In one embodiment, the communication between the local coil and the control and evaluation device may be unidirectional (e.g., exclusively from the local coil to the control and evaluation device). The data traffic may instead be bidirectional. In this case, the local coil includes at least one receiving system for receiving a digital signal from the environment of the local coil.

The data emitted by the second transmission system into the environment of the local coil may be determined as required. For example, the data may encompass at least one of the following data types: identification data for the local coil; configuration data for the local coil; internal local coil status data; test data for the digital magnetic resonance signal emitted by the first transmission system into the environment of the local coil; and the digital magnetic resonance signal emitted by the first transmission system into the environment of the local coil.

In another embodiment, a magnetic resonance system including a magnetic resonance device and a control and evaluation device for a magnetic resonance signal is provided. The magnetic resonance system includes at least one local coil according to the present embodiments. The control and evaluation device includes a receiving system for receiving data emitted by the first transmission system and the second transmission system of the local coil into the environment of the local coil.

In one embodiment of the magnetic resonance system, the first transmission system and the second transmission system of the local coil and the receiving system of the control and evaluation device are embodied such that a bridgeable second distance from the second transmission system to the receiving system of the control and evaluation device is higher than a bridgeable first distance from the first transmission system to the receiving system of the control and evaluation device.

DETAILED DESCRIPTION OF THE DRAWINGS

Figure 1:
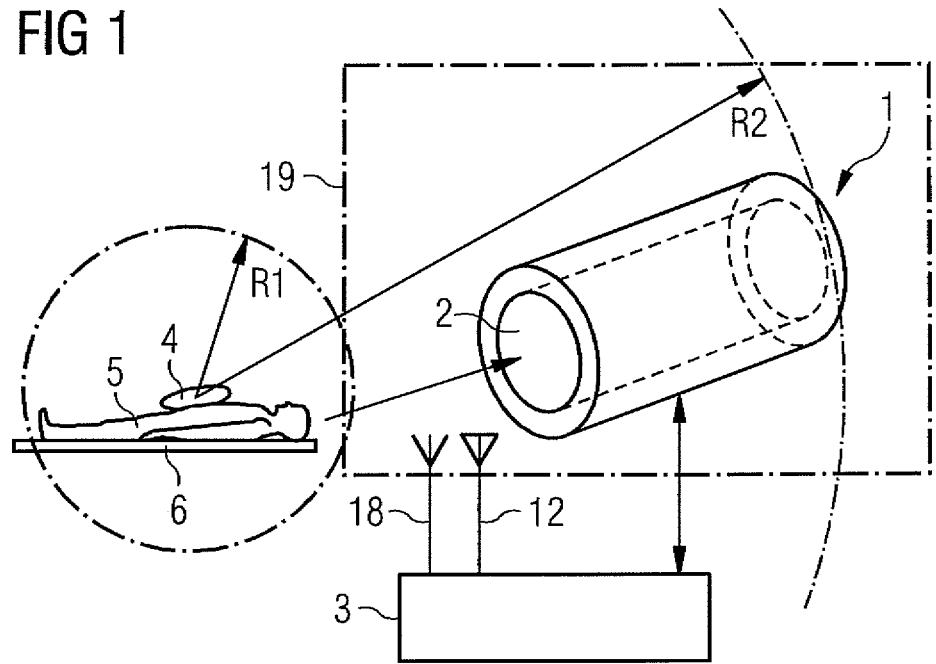
FIG. 1 shows one embodiment of a magnetic resonance system.

In the embodiment shown in FIG. 1, a magnetic resonance system includes a magnetic resonance installation 1 (e.g., a magnetic resonance device). The magnetic resonance installation 1 includes a base magnet to generate a static basic magnetic field that, in an examination volume 2, is at least substantially spatially homogenous. The magnetic resonance installation 1 also includes a whole body coil, with which a high-frequency excitation for the excitation of magnetic resonance may be generated in the examination volume 2. In addition to the location encoding, a gradient coil system may also be provided. The corresponding structure of the magnetic resonance installation 1 may be known to people skilled in the art.

The magnetic resonance system also includes a control and evaluation device 3 for the magnetic resonance installation 1.

The control and evaluation device 3 is used to control and operate the magnetic resonance installation 2. In addition, received magnetic resonance signals are supplied to the control and evaluation device 3. The control and evaluation device 3 preprocesses the magnetic resonance signals supplied to the control and evaluation device 3 and evaluates the magnetic resonance signals. The preprocessing and evaluation of the magnetic resonance signals may also be known to people skilled in the art.

The acquisition of excited magnetic resonance signals is effected by local coils 4. A local coil 4 of this kind is shown in FIG. 1. In one embodiment, a plurality of local coils 4 is provided.

An examination subject 5 (e.g., a person) may be placed on a patient couch 6 (or lies down on the patient couch 6). The local coils 4 are arranged on the examination subject 5 or in the vicinity of the examination subject 5. The patient couch 6, including the examination subject 5 and the local coils 4, is introduced into the examination volume 2. The examination subject 5 is excited to magnetic resonances by emission of the excitation signal. The magnetic resonance signal excited in the examination subject 5 is acquired by the local coils 4. This procedure may also be known to people skilled in the art.

Figure 2:
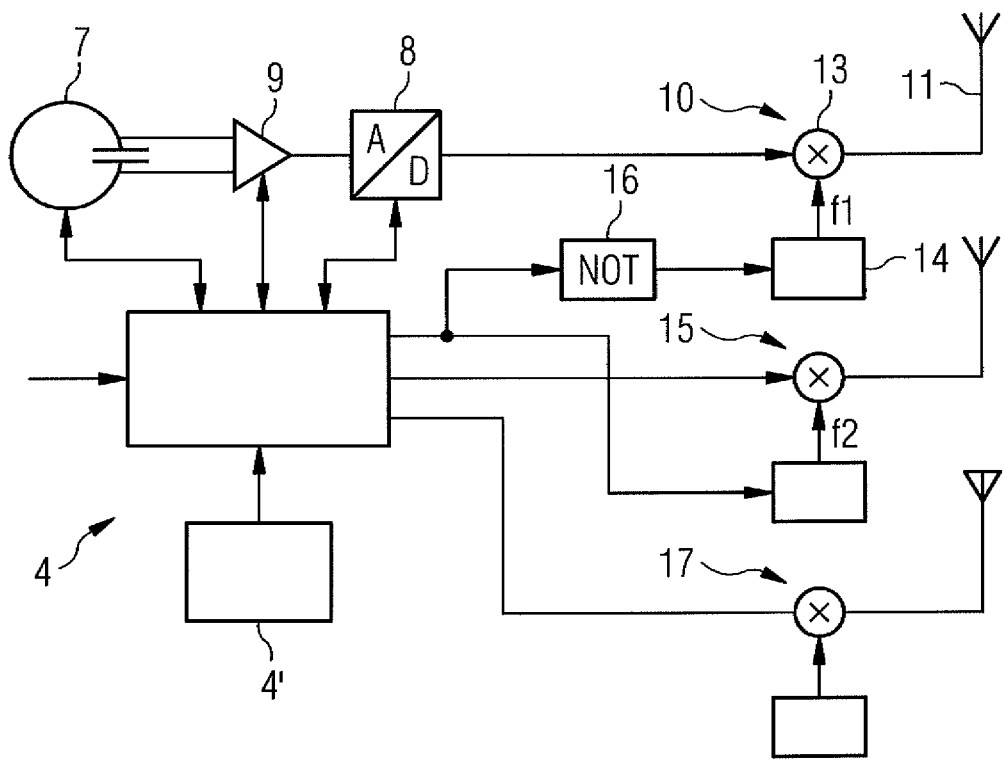
FIG. 2 shows the structure of one embodiment of a local coil.

As shown in FIG. 2, the local coil 4 includes a receiving antenna 7 for receiving the excited magnetic resonance signal. A plurality of receiving antennas 7 of this kind may be provided. The received magnetic resonance signal is an analog signal. The received magnetic resonance signal is supplied by the receiving antenna 7 to an analog-to-digital converter 8. In the case of a plurality of receiving antennas 7, a multiplexer may be provided upstream of the analog-to-digital converter 8. The analog-to-digital converter 8 converts the analog magnetic resonance signal supplied thereto into a corresponding digital magnetic resonance signal. The analog magnetic resonance signal may be supplied directly to the analog-to-digital converter 8. However, as shown in FIG. 2, a low-noise pre-amplifier (LNA) 9 may be arranged between the receiving antenna 7 and the analog-to-digital converter 8.

The analog-to-digital converter 8 supplies the digital magnetic resonance signal (e.g., bit-serially) to a first transmission system 10. The first transmission system 10 emits the digital magnetic resonance signal, optionally including test information such as, for example, parity bits and/or a cyclic redundancy check (CRC), via a transmitting antenna 11 into the environment of the local coil 4.

The emitted digital magnetic resonance signal is to be received. Therefore, the control and evaluation device 3 includes a receiving system 12. The receiving system 12 enables the control and evaluation device 3 to receive the digital magnetic resonance signal sent by the first transmission system 10 of the local coil 4.

The digital magnetic resonance signal has a high data rate (e.g., higher than 50 Mbit/s and/or higher than 100 Mbit/s). The data rate, at which the first transmission system 10 emits the digital magnetic resonance signal (hereinafter, first data rate) is to be at least equally high. In order to be able to transmit high data rates of this kind, the first transmission system 10 is to be operated at a relatively high carrier frequency f1. The first transmission system 10 includes a first carrier frequency 11 that lies at least in the (upper) one-digit, often in the two-digit and in isolated cases, in the (low) three-digit GHz range. For example, the first carrier frequency f1 may be 8 GHz, 20 GHz, 60 GHz, 64 GHz or 80 GHz. The first carrier frequency f1 may be at least 5 GHz. The first carrier frequency f1 may be supplied to, for example, a corresponding mixer 13 of the first transmission system 10 by a corresponding oscillator 14 of the first transmission system 10.

The local coil 4 according to the present embodiments also includes a second transmission system 15. The second transmission system 15 is different from the first transmission system 10. The second transmission system 15 emits digital data into the environment of the local coil 4 at a second data rate. However, the second data rate is lower (e.g., even significantly lower) than the first data rate. For example, the second data rate is lower than 10 Mbit/s.

Due to the lower data rate, the second transmission system 15 may be operated at a second carrier frequency f2 that is lower than the first carrier frequency f1 of the first transmission system. For example, the second carrier frequency f2 may be within the two- or three-digit MHz range or in the (low) one-digit GHz range (e.g., up to a maximum of 5 GHz). For example, the second transmission system 15 may be a Bluetooth or a WLAN system.

Different types of data may be emitted via the second transmission system 15. The following explains some possible types of data in more detail by way of example.

For example, the data may be identification data for the local coil 4. The identification data may, for example, encompass the type of the local coil 4. The identification data may additionally optionally encompass manufacturer and/or manufacturing data (e.g., location, time, factory, etc.). A unique product identification may be provided (e.g., two identical local coils 4 are assigned different identification numbers, similar to the chassis numbers in vehicles).

Alternatively or additionally, the data may, for example, encompass configuration data for the local coil 4. If, for example, the local coil 4 is inserted in a specific plug-in slot in the patient couch 6, this information may also be transmitted at the same time. In addition, details of the orientation of the local coil 4 in the room may be acquired (e.g., using Hall sensors or gyroscopes) and transmitted at the same time.

Alternatively or additionally, the data may encompass internal local coil status data 4. For example, details as to whether the receiving antenna 7 of the local coil 4 is off-resonance or activated, or in the case of a plurality of receiving antennas 7, which of the receiving antennas 7 are activated, may be transmitted via the second transmission system 15. In addition, details of the charging condition of an internal power supply 4' of the local coil 4 may optionally be acquired and transmitted. A self test may be performed, and the corresponding test result may be transmitted via the second transmission system 15. Control data or setting data may also be transmitted for the pre-amplifier 9 and for the analog-to-digital converter 8.

Alternatively or additionally, the transmitted data may encompass test data for the digital magnetic resonance signal, with the digital magnetic resonance signal itself being transmitted by the first transmission system 10. The test data may, for example, be the parity bits and the CRC.

Alternatively or additionally, the data may be transmitted by the second transmission system 15 to be the digital magnetic resonance signal, which had already been emitted by the first transmission system 10 into the environment of the local coil 4. This is explained in more detail below.

The two transmission systems 10, 15 may be operated simultaneously. The local coil 4 may include an interlocking circuit 16. The interlocking circuit 16 provides that only one of the two transmission systems 10, 15 is activated at any one time. There may be times, during which neither of the two transmission systems 10, 15 are operated. The interlocking circuit 16 prevents both transmission systems 10, 15 from transmitting simultaneously.

The data transmitted by the second transmission system 15 of the local coil 4 is also received by the receiving system 12 of the control and evaluation device 3. Therefore, the receiving system 12 of the control and evaluation device 3 serves not only to receive the data transmitted by the first transmission system 10, but also to receive data emitted by the second transmission system 15.

The data communication between the local coil 4 and the control and evaluation device 3 may be unidirectional. However, the data traffic is bidirectional. In this case, the local coil 4 includes at least one receiving system 17. The receiving system 17 receives a digital signal from the environment of the local coil 4. The control and evaluation device 3 includes a corresponding transmission system 18.

According to FIG. 1, the first transmission system 10 includes an effective range R1. According to FIG. 1, the second transmission system 15 includes an effective range R2 that is higher than the effective range R1 of the first transmission system 10. A bridgeable second distance from the second transmission system 15 to the receiving system 12 of the control and evaluation device 3 (i.e., the effective range R2) is therefore higher than a bridgeable first distance from the first transmission system 10 to the receiving system 12 of the control and evaluation device 3. For example, data transmissions from the first transmission system 10 to the receiving system 12 of the control and evaluation device 3 may be possible only when the local coil 4 is arranged inside an examination room 19 or in the examination volume 2. The data transmission from the second transmission system 15 to the control and evaluation device 3 is also possible when the second transmission system 15 is located outside the examination room 19 (e.g., in an adjacent preparation and recovery room).

For example, in the event of different effective ranges R1, R2, the digital magnetic resonance signal may be sent via both the first and the second transmission system 10, 15 of the local coil 4. This is because, for example, on reception by the local coil 4, the digital magnetic resonance signal (or a part of this signal) may be sent immediately via the first transmission system 10 to the control and evaluation device 3, where the digital magnetic resonance signal is evaluated immediately (e.g., almost in real time). Although a later transmission via the second transmission system 15 lasts longer so that real-time evaluation is no longer possible, data transmissions may, for example, be repeated in the event of transmission errors and/or in the event of only partial data transmissions to transmit the complete data later.

The present embodiments have numerous advantages. For example, ease of use and, if implemented via a reverse channel from the control and evaluation device 3 to the local coil 4, the local coil 4 may also be controlled, where simultaneous digital data transmission of the digital magnetic resonance signal from the local coil 4 to the control and evaluation device 3 is enabled.

The above description serves to describe the present embodiments. The scope of protection of the present embodiments is exclusively determined by the attached claims.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A local coil for magnetic resonance applications, the local coil comprising:
   a receiving antenna operable to receive an analog magnetic resonance signal excited in an examination subject by an excitation signal;
   an analog-to-digital converter that is supplied with the received analog magnetic resonance signal by the receiving antenna, the analog-to-digital converter being operable to convert the analog magnetic resonance signal into a digital magnetic resonance signal;
   a first transmission system that is supplied with the digital magnetic resonance signal by the analog-to-digital converter, the first transmission system being operable to transmit the digital magnetic resonance signal via a transmitting antenna at a first data rate into an environment of the local coil; and
   a second transmission system that is different from the first transmission system, the second transmission system being operable to transmit data into the environment of the local coil at a second data rate, the second data rate being lower than the first data rate.

2. The local coil as claimed in claim 1, wherein the first transmission system has a carrier frequency in the one- or two-digit GHz range.

3. The local coil as claimed in claim 2, wherein the first data rate is higher than 50 Mbit/s, the second data rate is lower than 10 Mbit/s, or a combination thereof.

4. The local coil as claimed in claim 2, wherein the second transmission system comprises a Bluetooth or a WLAN system.

5. The local coil as claimed in claim 2, wherein the first transmission system and the second transmission system are interlocked against each other.

6. The local coil as claimed in claim 1, wherein the first data rate is higher than 50 Mbit/s, the second data rate is lower than 10 Mbit/s, or a combination thereof.

7. The local coil as claimed in claim 6, wherein the second transmission system comprises a Bluetooth or a WLAN system.

8. The local coil as claimed in claim 6, wherein the first transmission system and the second transmission system are interlocked against each other.

9. The local coil as claimed in claim 6, further comprising at least one receiving system operable to receive a digital signal from the environment of the local coil.

10. The local coil as claimed in claim 1, wherein the second transmission system comprises a Bluetooth or a WLAN system.

11. The local coil as claimed in claim 10, wherein the first transmission system and the second transmission system are interlocked against each other.

12. The local coil as claimed in claim 10, further comprising at least one receiving system operable to receive a digital signal from the environment of the local coil.

13. The local coil as claimed in claim 1, wherein the first transmission system and the second transmission system are interlocked against each other.

14. The local coil as claimed in claim 13, further comprising at least one receiving system operable to receive a digital signal from the environment of the local coil.

15. The local coil as claimed in claim 13, wherein the data transmitted by the second transmission system into the environment of the local coil comprises identification data for the local coil, configuration data for the local coil, internal local coil status data, test data for the digital magnetic resonance signal transmitted by the first transmission system into the environment of the local coil, the digital magnetic resonance signal transmitted by the first transmission system into the environment of the local coil, or a combination thereof.

16. The local coil as claimed in claim 1, further comprising at least one receiving system operable to receive a digital signal from the environment of the local coil.

17. The local coil as claimed in claim 16, wherein the data transmitted by the second transmission system into the environment of the local coil comprises identification data for the local coil, configuration data for the local coil, internal local coil status data, test data for the digital magnetic resonance signal transmitted by the first transmission system into the environment of the local coil, the digital magnetic resonance signal transmitted by the first transmission system into the environment of the local coil, or a combination thereof.

18. The local coil as claimed in claim 1, wherein the data transmitted by the second transmission system into the environment of the local coil comprises identification data for the local coil, configuration data for the local coil, internal local coil status data, test data for the digital magnetic resonance signal transmitted by the first transmission system into the environment of the local coil, the digital magnetic resonance signal transmitted by the first transmission system into the environment of the local coil, or a combination thereof.

19. A magnetic resonance system comprising:
a magnetic resonance installation;
a control and evaluation device for a magnetic resonance signal; and
at least one local coil comprising:
a receiving antenna operable to receive an analog magnetic resonance signal excited in an examination subject by an excitation signal;
an analog-to-digital converter that is supplied with the received analog magnetic resonance signal by the receiving antenna, the analog-to-digital converter being operable to convert the analog magnetic resonance signal into a digital magnetic resonance signal;
a first transmission system that is supplied with the digital magnetic resonance signal by the analog-to-digital converter, the first transmission system being operable to transmit the digital magnetic resonance signal via a transmitting antenna at a first data rate into an environment of the local coil; and
a second transmission system that is different from the first transmission system, the second transmission system being operable to transmit data into the environment of the local coil at a second data rate, the second data rate being lower than the first data rate,
wherein the control and evaluation device comprises a receiving system operable to receive data transmitted by the first transmission system and the second transmission system of the local coil into the environment of the local coil.

20. The magnetic resonance system as claimed in claim 19, wherein a bridgeable second distance from the second transmission system to the receiving system of the control and evaluation device is higher than a bridgeable first distance from the first transmission system to the receiving system of the control and evaluation device.

* * * * *